(12) United States Patent
Bass

(10) Patent No.: US 8,230,304 B2
(45) Date of Patent: *Jul. 24, 2012

(54) WIRELESS TRANSMIT/RECEIVE UNIT HAVING A TURBO DECODER WITH CIRCULAR REDUNDANCY CODE SIGNATURE COMPARISON AND METHOD

(75) Inventor: David S. Bass, Great Neck, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 981 days.

This patent is subject to a terminal disclaimer.

(21) Appl. No.: 12/146,856

(22) Filed: Jun. 26, 2008

(65) Prior Publication Data

US 2008/0288847 A1 Nov. 20, 2008

Related U.S. Application Data

(63) Continuation of application No. 11/180,156, filed on Jul. 30, 2005, now Pat. No. 7,533,320, which is a continuation-in-part of application No. 10/044,109, filed on Oct. 19, 2001, now Pat. No. 6,956,912.

(60) Provisional application No. 60/248,440, filed on Nov. 14, 2000.

(51) Int. Cl.
*H03M 13/00* (2006.01)
(52) U.S. Cl. .................................... 714/774; 714/755
(58) Field of Classification Search ............... 714/774, 714/755
See application file for complete search history.

(56) References Cited

U.S. PATENT DOCUMENTS

| 5,113,400 | A | | 5/1992 | Gould et al. |
| 5,233,629 | A | | 8/1993 | Paik et al. |
| 5,414,738 | A | * | 5/1995 | Bienz ............................ 375/341 |
| 6,000,054 | A | * | 12/1999 | Bahr et al. ..................... 714/786 |
| 6,012,161 | A | | 1/2000 | Ariyavisitakul et al. |
| 6,202,189 | B1 | | 3/2001 | Hinedi et al. |
| 6,298,084 | B1 | | 10/2001 | Vinggaard et al. |
| 6,347,391 | B1 | * | 2/2002 | Uesugi et al. ................. 714/795 |
| 6,518,892 | B2 | | 2/2003 | Shen et al. |
| 6,526,531 | B1 | | 2/2003 | Wang |
| 6,591,390 | B1 | | 7/2003 | Yagyu |
| 6,665,357 | B1 | | 12/2003 | Somayazulu |
| 6,671,852 | B1 | * | 12/2003 | Ariel et al. ..................... 714/793 |
| 6,675,342 | B1 | | 1/2004 | Yagyu |
| 6,775,800 | B2 | | 8/2004 | Edmonston et al. |
| 6,865,708 | B2 | | 3/2005 | Wang |

(Continued)

FOREIGN PATENT DOCUMENTS

EP 1009098 6/2000

(Continued)

OTHER PUBLICATIONS

Peterson et al., "Cyclic Codes for Error Detection", Proceedings of the Ire, Jan. 1961, pp. 228-235.

(Continued)

*Primary Examiner* — M. Mujtaba K Chaudry
(74) *Attorney, Agent, or Firm* — Volpe and Koenig, P.C.

(57) ABSTRACT

An iterative turbo decoder for a wireless transmit receive unit (WTRU) of a wireless communication system and method for error correcting received communication signal data are provided. The decoder implements a stopping rule through use of signature codes to determine whether successive iterations of decoder data are the same.

38 Claims, 2 Drawing Sheets

U.S. PATENT DOCUMENTS

| | | | |
|---|---|---|---|
| 6,956,912 B2 * | 10/2005 | Bass .......................... 375/341 |
| 6,982,659 B2 | 1/2006 | Shen et al. |
| 2001/0028690 A1 | 10/2001 | Ebel |
| 2001/0052104 A1 | 12/2001 | Xu et al. |
| 2002/0010894 A1 | 1/2002 | Wolf et al. |

FOREIGN PATENT DOCUMENTS

| | | |
|---|---|---|
| EP | 1017176 | 7/2000 |
| EP | 1378086 | 7/2004 |
| JP | 2002-100995 | 4/2002 |
| WO | 00/27037 | 5/2000 |
| WO | 01/06662 | 1/2001 |

OTHER PUBLICATIONS

Shao et al., "Two Simple Stopping Criteria for Turbo Decoding", IEEE Transactions on Communications, vol. 47, No. 8, Aug. 1999, pp. 1117-1120.

* cited by examiner

WIRELESS TRANSMIT/RECEIVE UNIT HAVING A TURBO DECODER WITH CIRCULAR REDUNDANCY CODE SIGNATURE COMPARISON AND METHOD

CROSS-REFERENCE TO RELATED APPLICATION

This application is a continuation of U.S. patent application Ser. No. 11/180,156, filed Jul. 13, 2005, now U.S. Pat. No. 7,533,320, which is a continuation-in-part of U.S. patent application Ser. No. 10/044,109, filed Oct. 19, 2001, now U.S. Pat. No. 6,956,912, which claims priority from U.S. Provisional Patent Application No. 60/248,440, filed Nov. 14, 2000 which all are incorporated by reference herein as if fully set forth.

FIELD OF THE INVENTION

The present invention relates to communication devices and systems which use error correcting for received communication signals and, in particular, to such systems which utilize iterative turbo decoder systems.

BACKGROUND

CDMA communication systems are well known in the art. Generally, such systems comprise communication stations which transmit and receive wireless communication signals between each other, commonly generically referred to as wireless transmit receive units (WTRUs). Typically, base station WTRUs are provided which are capable of conducting wireless concurrent communications with a plurality of subscriber station WTRUs. In CDMA systems specified by the Third Generation Partnership Project (3GPP), base stations are called Node Bs, subscriber stations are called User Equipments (UEs) and the wireless interface between the Node Bs and UEs is known as the Uu interface. FIG. 2 illustrates a typical 3GPP CDMA system.

Turbo codes are a form of error correcting codes that yield performance near the Shannon limit for performance in an Additive While Gaussian Noise (AWGN) channel in a wireless communication system, such as 3GPP time division duplex using code division multiple access (TDD/CDMA). Decoders for these codes utilize an iterative algorithm which gives an improved estimate of the transmitted data at each iteration.

A significant design parameter for decoders is the number of iterations to be used. Decoders can be implemented in hardware or software, but in either case the number of iterations used drives the requirement for processing resources, including the processing throughput required to achieve the desired data rate, power consumed in decoding, and the amount of hardware needed in a hardware implementation.

Two general strategies are known in the art for determining the number of iterations in a decoder implementation. First, a fixed number of iterations can be determined as part of the design. This simplifies the implementation, but requires excessive processing resources since the fixed number must be set high enough to give the desired performance, i.e. bit error rate for the expected range of signal to noise levels, for nearly all cases where many decodings would require less than the fixed number of iterations.

Another strategy is to use a stopping rule to dynamically determine when decoding can be terminated without significantly effecting performance. The simplest stopping rule is the hard-decision-aided (HDA) criteria. When using this stopping rule, decoding is terminated when two successive iterations yield the same results. There are no changes in the hard decisions between iterations. Implementation of this rule for a coded block of N bits requires N memory locations to store the results of the previous implementation, as well as comparison of the previous N bit result to the current N bit result.

Conventional stopping criteria are disclosed in Shao, Rose Y., and Fossorier, Marc P.C., "Two Simple Stopping Criteria for Turbo Decoding", IEEE Transactions on Communications, Vol. 47, No. 8, August 1999. That paper presents two simple criteria for stopping the iteration process in turbo decoding. EP 1 017 176 and EP 1 009 098 describe the general state-of-the-art of turbo code error detection. EP 1 009 098 discloses use of cyclic redundancy checksum implemented by appending checksum bits to each frame.

A typical turbo decoder may produce turbo decoder estimate data having in excess of 5,000 bits of information for each iteration. Accordingly, the implementation of a conventional stopping rule requires an additional memory allocation in excess of 5,000 bits to store a first code iteration for comparison with a next code iteration in order to determine whether the same results have been produced.

The inventor has recognized that it would be desirable to provide an improved turbo decoder which can more efficiently implement a stopping rule with a lesser requirement for additional memory.

SUMMARY

A wireless transmit receive unit WTRU of a wireless communication system having a selectively configured iterative turbo decoder and a method for error correcting received communication signal data are provided. The decoder recursively evaluates signal data for a selected number of iterations.

During each iteration, decoder circuitry produces a new estimate of the transmitted data block, also called the extrinsics. A decoder data memory stores the extrinsics generated for one decoding iteration.

Signature code generating circuitry generates code signatures corresponding to each new estimate of the transmitted data block for each decoder iteration. The code signatures are preferably at least 20 times smaller than the data which they represent and for practical purposes will normally be at least 100 times smaller. A relatively small code signature memory stores the code signature corresponding to turbo decoder estimate data generated for one decoding iteration.

A comparator is operatively associated with the signature code circuitry and decoder circuitry. The comparator compares a generated code signature for a new estimate of the transmitted data block being produced and stored for a present decoder iteration with the contents of the signature memory. If the comparison reflects equality, the decoder circuitry ceases iteration processing. If the comparison reflects inequality, the generated code signature is stored in the signature memory where it is available for comparison relative to a code signature for a next decoder iteration.

The comparator may be used to store the generated code in the signature register. As an alternative, the comparator may simply access the signature register before the signature code generator outputs the new signature code. This permits the signature code generator to output the new signature code to both the comparator and to the signature register, as indicated in phantom, which eliminates the need for the comparator to perform a store operation to the signature code register.

Preferably, the comparator is operatively associated with the decoder circuitry to control decoder circuitry iteration processing only after a selected minimum number of iterations have occurred. Also, preferably the decoder circuitry ceases iteration processing if a predetermined limit of iterations has occurred. The limit of iterations is preferably an integer at least three greater than the selected minimum number. In a preferred embodiment, the selected minimum number is four (4) and the limit is eight (8).

It is an object of the present invention to provide an iterative turbo decoder which selectively implements a stopping rule with a lesser memory requirement than the prior art.

Other objects and advantages of the present invention will be apparent from the following description of a presently preferred embodiment.

BRIEF DESCRIPTION OF THE DRAWING(S)

DETAILED DESCRIPTION OF THE PREFERRED EMBODIMENT(S)

Figure 1:
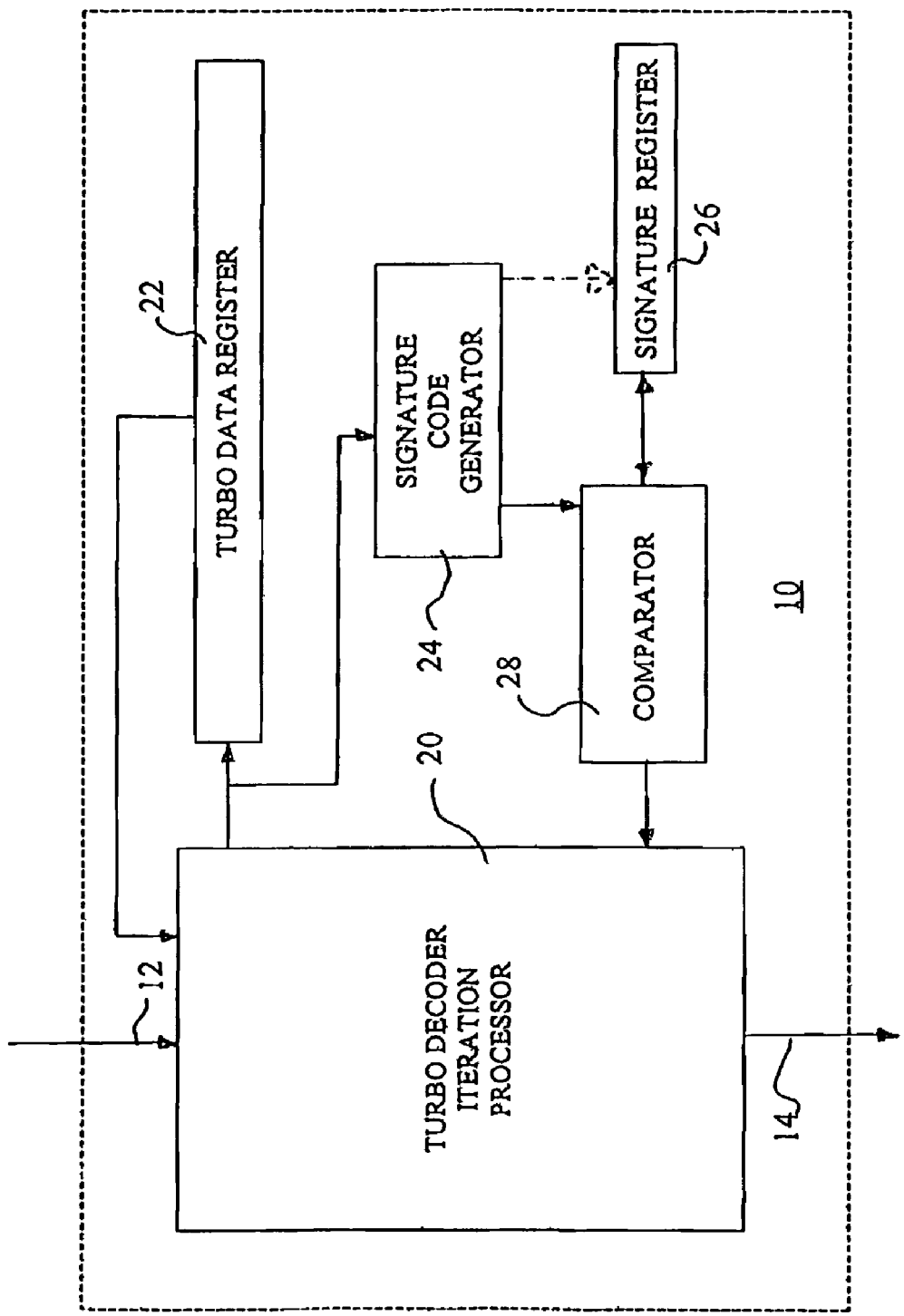
FIG. 1 is a schematic diagram of a turbo decoder of a WTRU made in accordance with the teachings of the present invention.
Figure 2:
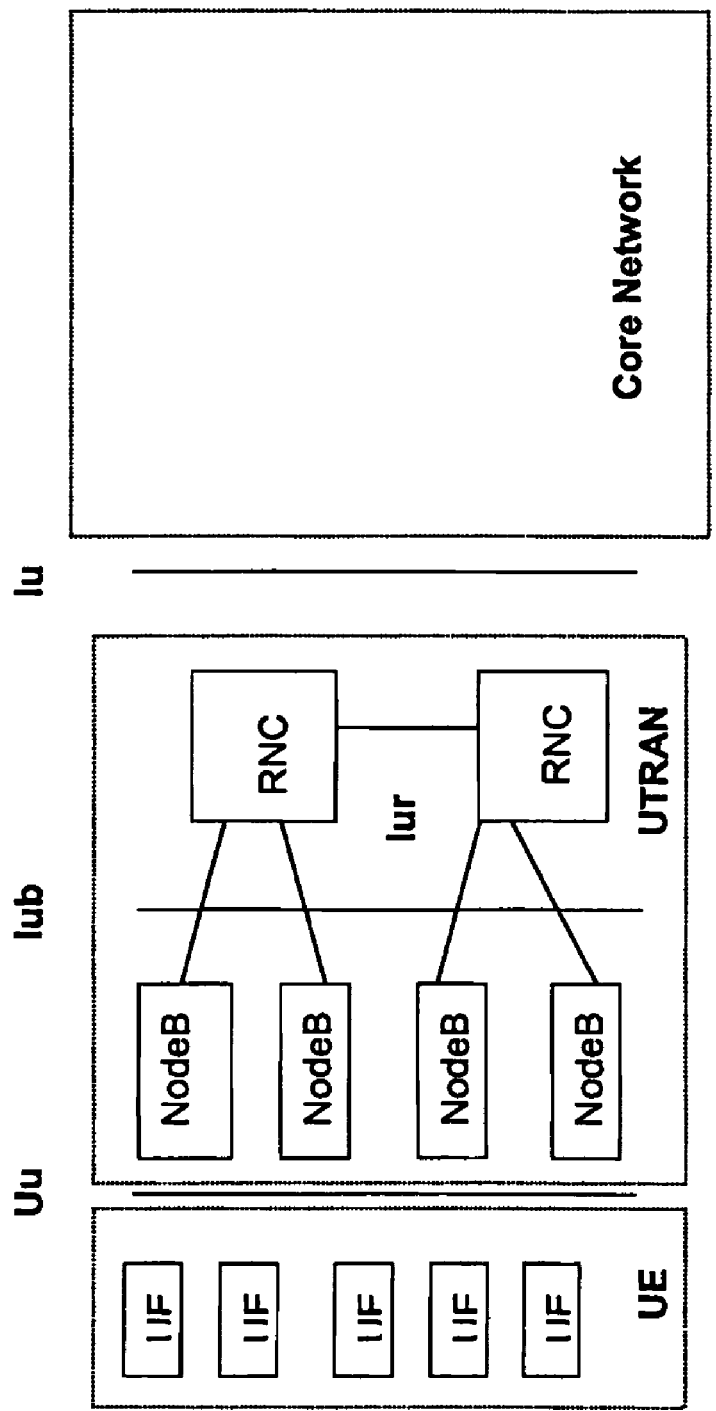
FIG. 2 is a schematic diagram of a typical CDMA system in accordance with 3GPP specifications.

With reference to FIG. 1, there is shown a turbo decoder 10 having a communication signal input 12 and an output 14. The turbo decoder 10 includes turbo decoding iteration processing circuitry 20 and an associated turbo data register 22. The decoder processing circuitry 20 receives data blocks of communication signals via input 12 and generates a new estimate of the transmitted data block which is stored in register 22. The processing circuitry 20 is recursively associated with the turbo data register 22 such that the processor 20 utilizes the contents of the turbo data register 22 for the second and each successive iteration of turbo decoding processing.

The turbo decoding processing circuitry 20 is preferably configured with a predetermined limit as to the number of processing iterations which will occur for any given block of communication data such that the turbo decoder output is based upon the contents of the turbo decoder register after the last decoding iteration. Preferably, the maximum number of processing iterations performed by the processor 20 is eight (8).

The processor 20 also implements a stopping rule where fewer than the maximum number of iterations are needed. When the decoder determines that the estimate data being generated for successive iterations is not changing, iterative processing is stopped. In lieu of providing a relatively large amount of additional memory to store a prior iteration of estimate data, a relatively simplistic signature code generator 24 and a relatively small code signature register 26 are provided as inputs to a comparator 28 which is operatively associated with the iteration processor 20 to implement the stopping rule.

Preferably, the comparator 28 is operatively associated with the decoder circuitry 20 to control decoder circuitry iteration processing only after a selected minimum number of iterations have occurred. Also, preferably the decoder circuitry 20 ceases iteration processing if a predetermined limit of iterations has occurred. The limit of iterations is preferably an integer at least three greater than the selected minimum number. In a preferred embodiment, the selected minimum number is four (4) and the limit is eight (8).

For a turbo decoder which generates binary estimate data on the order of 5,114 bits for a single iteration, the signature code generator preferably comprises a simple 16-bit binary divider which divides the 5,114 binary string of data by a selected 16-bit binary number and outputs the remainder which results from the division function to the comparator 28. The remainder will necessarily not exceed 16 bits since the divisor is 16 bits in length.

For a 16-bit divisor, preferably the binary number 1000000000000011 is utilized. Such a divisor corresponds to a binary polynomial represented as $1+x^{14}+x^{15}$. The binary division performed by code generator 24, mathematically corresponds to dividing a binary polynomial representation of the 5,114 bit iteration estimate data by the polynomial $1+X^{14}+X^{15}$ using binary (i.e. modulo 2) mathematics. The remainder of the binary division corresponds to the remainder polynomial. The odds that the remainder will be the same for two successive 5,114 bit string of estimate data are about 1 in $2^{16}$ which the inventor has determined is an acceptable risk factor.

Mathematical correspondence and use of polynomial representations to generate signal codes is known in the art and is discussed in, Pearson, W. W. and Brown, D. T., "Signal Codes For Error Detection", *Proceedings of the IRE*, January 1961. The inventor has recognized that this form of encoding has application to turbo decoders.

In operation, the turbo decoder processor 20 outputs, for a given iteration, N bits of estimate data to the turbo data register 22 and signal code generator 24. The signal code generator 24 generates a corresponding code signature having M bits which is preferably at least 100 times smaller than N which is input to the comparator 28. The comparator 28 compares the M bit signature code input from the code generator 24 with the contents of the signature register 26 to determine if they are equal.

If the comparator determines equality, a signal is sent to the processor 20 to stop iteration processing and output the turbo coding results. If the comparator detects inequality, the M-bit signature code received from the signature code generator 24 is stored in the signature register 26.

The comparator 28 may be used to store the generated code in the signature register 26. As an alternative, the comparator 28 may simply access the signature register 26 before the signature code generator 24 outputs the new signature code. This permits the signature code generator 24 to output the new signature code to both the comparator 28 and to the signature register 26, as indicated in phantom, which eliminates the need for the comparator 28 to perform a store operation to the signature code register 26.

Where a 5,114 bit block of binary data is produced for a decoder iteration, the signature code generator 24 preferably divides by 1000000000000011 to produce a remainder of no greater than 16 bits so that the signature register 26 need only have a 16-bit storage capacity.

The present invention is particularly suited to hardware implementations where the cost of generating the signature code is small, and the cost of the additional memory required would be high. It can also be used, however, in software implementations.

What is claimed is:

1. A wireless transmit receive unit (WTRU) configured for use in wireless communications comprising:
   an iterative decoder processor having a first input and a first output;
   the iterative decoder processor configured to output via the first output an iteration of estimate data produced from communication signal data received via the first input;

a decoder data memory configured to store the iteration of estimate data having an input coupled to the first output of the iterative decoder processor and an output;

the iterative decoder processor having a second input coupled to the output of the decoder data memory for receiving the stored iteration of estimate data and a second output for outputting an iteration of estimate data;

the iterative decoder processor being selectively controllable to process the stored iteration of estimate data received from the decoder data memory via the second input to produce an iteration of estimate data for output via the first or second outputs;

an iteration control circuit having an input coupled to the first output of the iterative decoder processor and a signature code generator configured to generate code signatures corresponding to iterations of estimate data such that each code signature has a bit size at least twenty times smaller than an iteration of estimate data; and the iteration control circuit configured to control the iterative decoder processor to process the stored iteration of estimate data received from the decoder data memory via the second input to produce an iteration of estimate data for output via the first or second outputs based on a comparison of a generated code signature for the iteration of estimate data in a comparator.

2. The WTRU according to claim 1 wherein the iterative decoder processor is configured to process the stored iteration of estimate data received from the decoder data memory via the second input to produce an iteration of estimate data for output via the second output only after a selected number of iterations have occurred.

3. The WTRU according to claim 2 wherein the iterative decoder processor is configured to process the stored iteration of estimate data received from the decoder data memory via the second input to produce an iteration of estimate data for output via the second output if a predetermined limit of iterations has occurred where the limit is an integer at least three greater than the selected number.

4. The WTRU according to claim 3 wherein the iterative decoder processor is configured such that the selected number is four (4) and the limit is eight (8).

5. The WTRU according to claim 1 wherein the signature code generator is configured to generate code signatures such that each code signature is at least 100 times smaller than an iteration of estimate data.

6. The WTRU according to claim 1 wherein an iteration of estimate data is a binary string and the signature code generator comprises a binary divider configured to divide corresponding binary strings of an iteration of estimate data by a selected binary divisor to generate a code signature.

7. The WTRU according to claim 6 wherein the iterative decoder processor is configured to produce iterations of estimate data that are binary strings at least 5,000 bits in length and the binary divisor used by the signature code generator is a 16-bit binary number whereby the code signatures are no greater than 16 bits.

8. The WTRU according to claim 7 wherein the signature code generator is configured such that the divisor is 1000000000000011.

9. The WTRU according to claim 1 wherein the iteration control circuit has a signature memory and a comparator and is configured such that a generated code signature is stored by the comparator in the signature memory to be available for comparison relative to a code signature for a next iteration.

10. The WTRU according to claim 1 wherein the iteration control circuit has a signature memory and a comparator and is configured such that a generated code signature is stored by the signature code generator in the signature memory to be available for comparison relative to a code signature for a next iteration.

11. A method for use in wireless communications comprising:

receiving communication signal data by an iterative decoder processor via a first input and outputting an iteration of estimate data produced therefrom via a first output;

storing individual iterations of estimate data in a decoder data memory via an input coupled to the first output of the iterative decoder processor;

receiving a stored iteration of estimate data from the decoder data memory by the iterative decoder processor via a second input coupled;

selectively controlling the iterative decoder processor to process the stored iteration of estimate data received from the decoder data memory to produce an iteration of estimate data for output via the first output or a second output; and the selectively controlling including generating code signatures corresponding to iterations of estimate data such that each code signature has a bit size at least twenty times smaller than an iteration of estimate data and controlling the iterative decoder processor to process the stored iteration of estimate data received from the decoder data memory via the second input to produce an iteration of estimate data for output via the first or second outputs based on a comparison of a generated code signature for the iteration of estimate data.

12. The method according to claim 11 wherein the iterative decoder processor is controlled to process the stored iteration of estimate data received from the decoder data memory via the second input to produce an iteration of estimate data for output via the second output only after a selected number of iterations have occurred.

13. The method according to claim 12 wherein the iterative decoder processor is controlled to process the stored iteration of estimate data received from the decoder data memory via the second input to produce an iteration of estimate data for output via the second output if a predetermined limit of iterations has occurred where the limit is an integer at least three greater than the selected number.

14. The method according to claim 13 wherein the iterative decoder processor is controlled such that the selected number is four (4) and the limit is eight (8).

15. The method according to claim 11 wherein signature codes are generated such that each code signature is at least 100 times smaller than an iteration of estimate data.

16. The method according to claim 11 wherein the produced iterations of estimate data are binary strings and signature codes are generated by a binary divider configured to divide corresponding binary strings of an iteration of estimate data by a selected binary divisor to generate a code signature.

17. The method according to claim 16 wherein the produced iterations of estimate data are binary strings at least 5,000 bits in length and the binary divisor used is a 16-bit binary number whereby the code signatures are no greater than 16 bits.

18. The method according to claim 17 wherein the divisor is 1000000000000011.

19. The method according to claim 11 wherein a generated code signature is stored by a comparator in a signature memory to be available for comparison relative to a code signature for a next iteration.

20. The method according to claim 11 wherein a generated code signature is stored by a signature code generator in a signature memory to be available for comparison relative to a code signature for a next iteration.

21. The method according to claim 11 wherein the iterative decoder processor is controlled to process the stored iteration of estimate data received from the decoder data memory via the second input to produce an iteration of estimate data for output via the first or second outputs based on a comparison of the generated code signature for the iteration of estimate data with a generated code signature for a prior iteration of estimate data.

22. The WTRU according to claim 1 wherein the iterative decoder processor is configured to process an iteration of estimate data received from the decoder data memory via the second input to produce an iteration of estimate data for output via the first or second outputs based on a comparison of the generated code signature for the iteration of estimate data with a generated code signature for a prior iteration of estimate data.

23. The WTRU according to claim 1 wherein the iteration control circuit includes a signature code memory and the iterative decoder processor is configured to process the stored iteration of estimate data received from the decoder data memory via the second input to produce an iteration of estimate data for output via the first or second outputs based on a comparison of the generated code signature for the iteration of estimate data with a generated code signature for a prior iteration of estimate data stored in the signature code memory.

24. The WTRU according to claim 1 wherein the iterative decoder processor is configured to process the stored iteration of estimate data received from the decoder data memory via the second input to produce an iteration of estimate data for output via the first or second outputs based on a comparison of the generated code signature for the iteration of estimate data with a code signature stored in a memory.

25. A wireless transmit receive unit (WTRU) configured for use in wireless communications comprising:
an iterative decoder processor having an input for receiving communication signal data and an output for outputting iterations of estimate data;
a decoder data memory operatively associated with the iterative decoder processor to store iterations of estimate data produced by the iterative decoder processor;
the iterative decoder processor configured to produce a first iteration of estimate data based on communication signal data received via the input and subsequent iterations of estimate data for the received communication signal data based on prior iterations of estimate data for the received communication signal data;
an iteration control circuit operatively associated with the iterative decoder processor to implement a stopping rule with respect to the generation of iterations of estimate data for the received communication signal data;
the iteration control circuit having a signature code generator configured to generate code signatures corresponding to iterations of estimate data such that each code signature has a bit size at least twenty times smaller than an iteration of estimate data; and
the iteration control circuit configured to control the iterative decoder processor to stop generating iterations of estimate data for the received communication signal data when a generated code signature for an iteration of estimate data for the received communication signal data reflects equality in a code signature comparator.

26. The WTRU according to claim 25 wherein the iteration control circuit is configured to control the iterative decoder processor to stop generating iterations of estimate data for the received communication signal data only after a selected minimum number of iterations have occurred.

27. The WTRU according to claim 25 wherein the iteration control circuit is configured to control the iterative decoder processor to stop generating iterations of estimate data for the received communication signal data if a predetermined limit of iterations has occurred.

28. The WTRU according to claim 25 wherein the iteration control circuit is configured to control the iterative decoder processor to stop generating iterations of estimate data for the received communication signal data when a generated code signature for an iteration of estimate data for the received communication signal data reflects equality with a generated code signature for a prior iteration of estimate data for the received communication signal data.

29. The WTRU according to claim 25 wherein the iteration control circuit includes a code memory and is configured to control the iterative decoder processor to stop generating iterations of estimate data for the received communication signal data when a generated code signature for an iteration of estimate data for the received communication signal data reflects equality with a code signature stored in the code memory.

30. The WTRU according to claim 25 wherein the signature code generator is configured to generate code signatures such that each code signature is at least 100 times smaller than an iteration of estimate data.

31. The WTRU according to claim 25 wherein an iteration of estimate data is a binary string and the signature code generator comprises a binary divider configured to divide corresponding binary strings of an iteration of estimate data by a selected binary divisor to generate a code signature.

32. A method for use in wireless communications comprising:
receiving communication signal data by an iterative decoder processor;
producing a first iteration of estimate data of the received communication signal data and storing the first iteration of estimate data of the received communication signal data in a decoder data memory;
producing subsequent iterations of estimate data for the received communication signal data based on prior iterations of estimate data for the received communication signal data; and
implementing a stopping rule with respect to the generation of iterations of estimate data for the received communication signal data including:
generating code signatures corresponding to iterations of estimate data such that each code signature has a bit size at least twenty times smaller than an iteration of estimate data; and
controlling the iterative decoder processor to stop generating iterations of estimate data for the received communication signal data when a generated code signature for an iteration of estimate data for the received communication signal data reflects equality in a code signature comparator.

33. The method according to claim 32 wherein the controlling the iterative decoder processor to stop generating iterations of estimate data for the received communication signal data is performed only after a selected minimum number of iterations have occurred.

34. The method according to claim 32 wherein the controlling the iterative decoder processor to stop generating iterations of estimate data for the received communication signal data is performed if a predetermined limit of iterations has occurred.

35. The method according to claim 32 wherein the controlling the iterative decoder processor to stop generating iterations of estimate data for the received communication signal data is performed when a generated code signature for an iteration of estimate data for the received communication signal data reflects equality with a generated code signature for a prior iteration of estimate data for the received communication signal data.

36. The method according to claim 32 wherein the controlling the iterative decoder processor to stop generating iterations of estimate data for the received communication signal data is performed when a generated code signature for an iteration of estimate data for the received communication signal data reflects equality with a code signature stored in a code memory.

37. The method according to claim 32 wherein code signatures are generated such that each code signature is at least 100 times smaller than an iteration of estimate data.

38. The method according to claim 32 wherein code signatures are generated by dividing a binary string of an iteration of estimate data by a selected binary divisor.

\* \* \* \* \*

UNITED STATES PATENT AND TRADEMARK OFFICE
CERTIFICATE OF CORRECTION

| | | |
|---|---|---|
| PATENT NO. | : 8,230,304 B2 | Page 1 of 1 |
| APPLICATION NO. | : 12/146856 | |
| DATED | : July 24, 2012 | |
| INVENTOR(S) | : David S. Bass | |

It is certified that error appears in the above-identified patent and that said Letters Patent is hereby corrected as shown below:

ON THE TITLE PAGE

At Item (63), Related U.S. Application Data, on the second line of this section, after "Jul.", delete "30," and insert --13,--.

At Item (56), U.S. PATENT DOCUMENTS, page 1, right column, after "6,347,391, B1 * 2/2002 Uesugi et al. 714/795", insert --6,353,911 3/2002 Brink--.

Signed and Sealed this
Nineteenth Day of March, 2013

Teresa Stanek Rea
*Acting Director of the United States Patent and Trademark Office*